United States Patent
Kim

(10) Patent No.: US 11,067,619 B2
(45) Date of Patent: Jul. 20, 2021

(54) INTEGRATED CIRCUIT HAVING TRIM FUNCTION FOR COMPONENT

(71) Applicant: Silicon Works Co., Ltd., Daejeon (KR)

(72) Inventor: Il Kwon Kim, Daejeon (KR)

(73) Assignee: Silicon Works Co., Ltd., Daejeon (KR)

(*) Notice: Subject to any disclaimer, the term of this patent is extended or adjusted under 35 U.S.C. 154(b) by 0 days.

(21) Appl. No.: 17/122,254

(22) Filed: Dec. 15, 2020

(65) Prior Publication Data

US 2021/0194472 A1 Jun. 24, 2021

(30) Foreign Application Priority Data

Dec. 24, 2019 (KR) .................. 10-2019-0173695

(51) Int. Cl.
| | | |
|---|---|---|
| *G01R 31/26* | (2020.01) | |
| *H03K 5/22* | (2006.01) | |
| *H03K 5/01* | (2006.01) | |
| *H03K 21/02* | (2006.01) | |
| *H03K 5/24* | (2006.01) | |
| *H03K 5/26* | (2006.01) | |

(52) U.S. Cl.
CPC .............. *G01R 31/26* (2013.01); *H03K 5/01* (2013.01); *H03K 5/22* (2013.01); *H03K 5/24* (2013.01); *H03K 5/26* (2013.01); *H03K 21/02* (2013.01)

(58) Field of Classification Search
CPC . G01R 31/26; H03K 5/01; H03K 5/22; H03K 5/24; H03K 5/26; H03K 21/02
USPC ............... 327/306, 518; 702/57, 65
See application file for complete search history.

(56) References Cited

U.S. PATENT DOCUMENTS

| 7,188,036 | B2* | 3/2007 | Strittmatter ........ G01R 31/2853 |
| | | | 324/130 |
| 7,280,929 | B1 | 10/2007 | Zhao |
| 7,852,099 | B1* | 12/2010 | Clark ............... G01R 31/31908 |
| | | | 324/762.02 |
| 8,929,158 | B1* | 1/2015 | Wang ................... G11C 29/021 |
| | | | 365/189.09 |
| 9,411,352 | B1* | 8/2016 | Sung ....................... G05F 1/625 |
| 2006/0274594 | A1* | 12/2006 | Huckaby .............. G11C 29/021 |
| | | | 365/226 |
| 2010/0110786 | A1* | 5/2010 | Kang ................. G11C 16/0483 |
| | | | 365/185.2 |

FOREIGN PATENT DOCUMENTS

| KR | 2006-0069138 A | 6/2006 |
| KR | 2007-0074408 A | 7/2007 |
| KR | 2010-0084247 A | 7/2010 |

* cited by examiner

*Primary Examiner* — William Hernandez
(74) *Attorney, Agent, or Firm* — Polsinelli PC

(57) ABSTRACT

Disclosed is an integrated circuit having a trim function for an embedded analog component or digital component. The integrated circuit includes a trim value generator configured to provide a varying trim value, a measurement target selected from a digital component and an analog component and configured to provide a measured value as a result of an internal operation corresponding to the trim value, a determination unit configured to determine the measured value based on a reference value received from the outside and to provide a trim control signal when the measured value corresponds to a preset target value, and a storage configured to store a current trim value as a measured result value in response to the trim control signal.

15 Claims, 3 Drawing Sheets

INTEGRATED CIRCUIT HAVING TRIM FUNCTION FOR COMPONENT

BACKGROUND

1. Technical Field

The present disclosure relates to an integrated circuit, and more particularly, to an integrated circuit having a trim function for calculating a trim value by measuring an embedded analog component or digital component and storing the trim value as a measured result value.

2. Related Art

An integrated circuit is designed for various uses and fabricated as a chip through a semiconductor process.

The integrated circuit may be fabricated as a system-on chip. The system-on chip has a structure in which an analog component and a digital component are mixed.

The analog component and digital component of the integrated circuit may have an output characteristic different from that of the design due to the influence of several environments in a fabrication process.

An example of the analog component may be a bandgap reference voltage generator. The bandgap reference voltage generator may be fabricated to output a bandgap reference voltage having a level higher or lower than a designed level due to the influence of several environments in a fabrication process.

An example of the digital component may be an oscillator. The oscillator may be fabricated to provide an output signal having a frequency that has a level higher or lower than a designed level due to the influence of several environments in a fabrication process.

In general, a change in the characteristic of the integrated circuit occurring in the fabrication process may be corrected after measured in a test process.

For the test process, the integrated circuit needs to be designed to have a plurality of input terminals and measurement terminals for a test. Accordingly, the integrated circuit has inconvenience and disadvantages in terms of the design and layout of the internal circuit.

Furthermore, the test process requires expensive measurement equipment having high precision. However, the number of integrated circuits which may be tested using the measurement equipment is limited. Accordingly, there is a problem in that the productivity of the integrated circuit is limited.

Furthermore, a general integrated circuit is required to additionally perform an operation of storing, as a test result, a trim value, obtained as a result of the test, in an internal memory.

For this reason, the general integrated circuit has problems in that it has limited productivity and is required to perform an additional operation accompanied by a test.

SUMMARY

Various embodiments are directed to providing an integrated circuit having a trim function for a component, which has a simple circuit therein for a trim function for measuring a measurement target, has advantages in terms of the design and the layout by storing, in an embedded storage, a measured value obtained by the trim function, and does not require an external connection or an expensive measurement device for a test process, and can improve productivity.

In an embodiment, an integrated circuit having a trim function for a component may include a trim value generator configured to provide a varying trim value, a measurement target selected from a digital component and an analog component and configured to provide a measured value as a result of an internal operation corresponding to the trim value, a determination unit configured to determine the measured value based on a reference value received from the outside and to provide a trim control signal when the measured value corresponds to a preset target value, and a storage configured to store a current trim value as a measured result value in response to the trim control signal.

In an embodiment, an integrated circuit having a trim function for a component may include a trim value generator configured to provide a varying trim value, a digital component configured to provide a measured value having a frequency as a result of an internal operation corresponding to the trim value, a determination unit configured to determine the frequency of the measured value based on a reference frequency of a reference signal received from the outside and to provide a trim control signal when the frequency of the measured value corresponds to a preset target value, and a storage configured to store a current trim value as a measured result value in response to the trim control signal.

In an embodiment, an integrated circuit having a trim function for a component may include a trim value generator configured to provide a varying trim value, an analog component configured to provide a measured value having an analog level as a result of an internal operation corresponding to the trim value, a determination unit configured to determine the analog level of the measured value based on a reference level of a reference signal received from the outside and to provide a trim control signal when the analog level of the measured value corresponds to a preset target value, and a storage configured to store a current trim value as a measured result value in response to the trim control signal.

The integrated circuit having the trim function for a component according to an embodiment of the present disclosure can have advantages in terms of the design and the layout because it requires only a terminal for receiving the reference signal from the outside for the trim function.

Moreover, the integrated circuit according to an embodiment of the present disclosure can have advantages in that it does not require an external connection or expensive measurement device for a test process and can simply perform a test process, by including simple parts for a trim on a component.

Furthermore, the integrated circuit according to an embodiment of the present disclosure can have an advantage in that it can improve productivity because it can simultaneously perform a test process on many parts by simply performing the test process and it does not require an additional operation after a test process by storing a measured value, obtained as a result of a trim, in the embedded storage.

DETAILED DESCRIPTION

Figure 1:
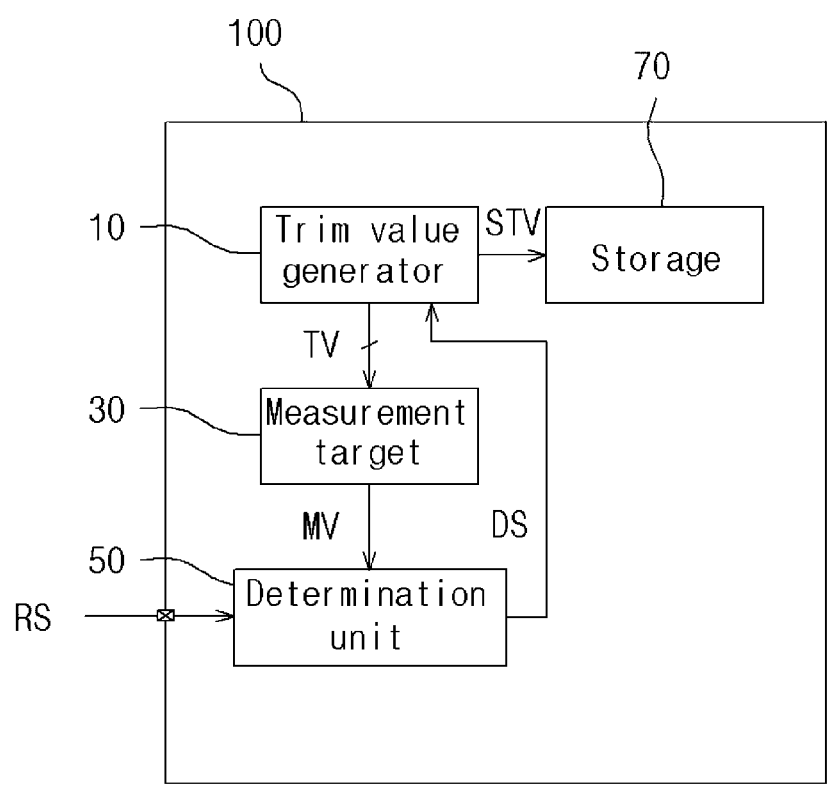
FIG. 1 is a block diagram illustrating a preferred embodiment of an integrated circuit having a trim function for a component according to an embodiment of the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

An integrated circuit 100 having a trim function for measuring a component according to an embodiment of the present disclosure may be understood to include an analog component or a digital component, such as a microcomputer or a microprocessor, or to have a configuration in which an analog component and a digital component are mixed.

Figure 2:
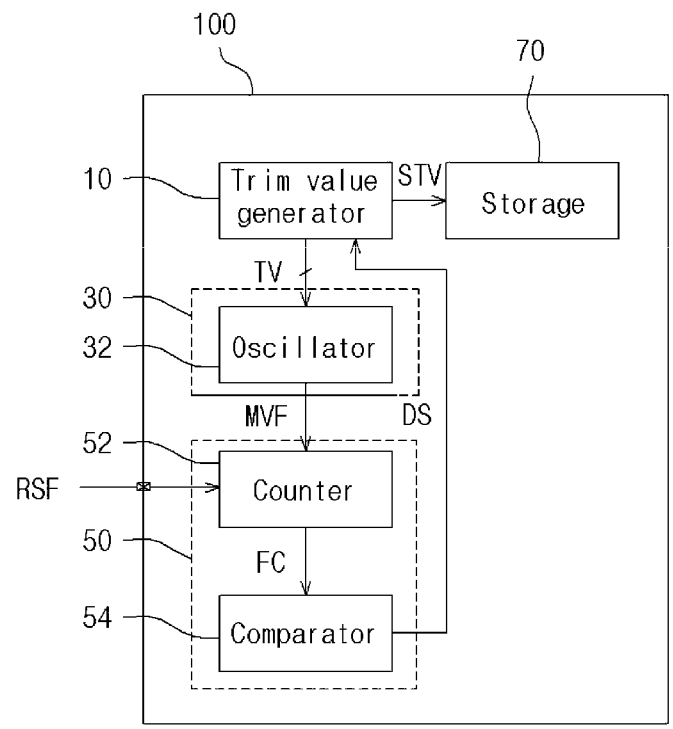
FIG. 2 is a block diagram of the integrated circuit according to a detailed embodiment of the present disclosure.

The digital component may be understood to provide an output signal having a frequency characteristic or digital value for digital logic, such as an oscillator. A detailed example of the present disclosure is described later with reference to FIG. 2 illustrating an oscillator.

Figure 4:
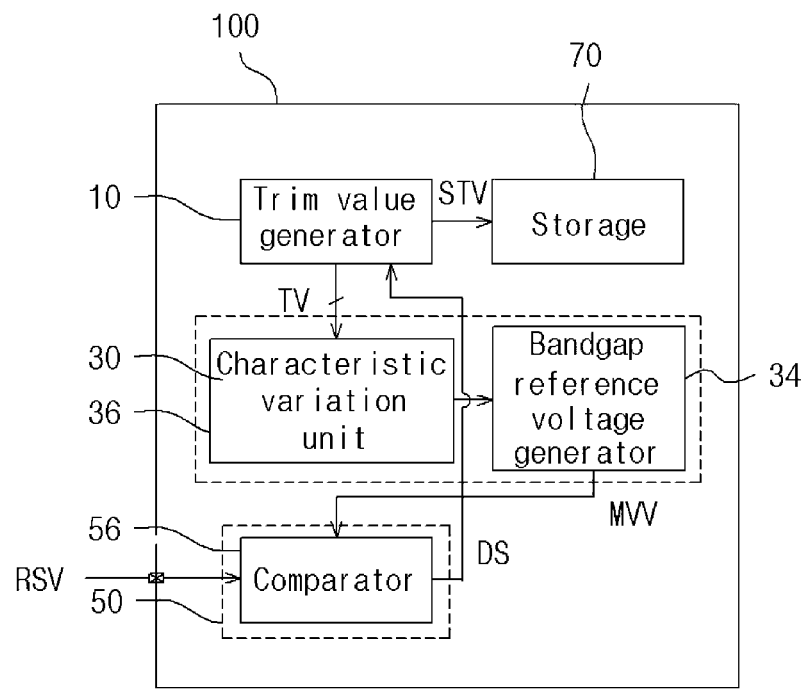
FIG. 4 is a block diagram of an integrated circuit according to another detailed embodiment of the present disclosure.

Furthermore, the analog component may be understood to provide an output signal having an analog level, such as a voltage or a current, like a bandgap reference voltage generator. Another detailed example of the present disclosure is described later with reference to FIG. 4 illustrating a bandgap reference voltage generator.

First, referring to FIG. 1, the integrated circuit 100 having the trim function for measuring a component according to an embodiment of the present disclosure includes a trim value generator 10, a measurement target 30, a determination unit 50, and a storage 70. In this case, the trim value generator 10, the determination unit 50, and the storage 70 may be understood to correspond to circuits for the trim function for measuring the measurement target 30.

The trim value generator 10 is configured to provide a varying trim value TV. The trim value generator 10 may be configured to provide the trim value TV as a digital value. To this end, the trim value generator 10 is configured to provide multiple bits in parallel.

For example, the trim value TV may be sequentially provided as a value of bits in order of "0000", "0001", "0010", . . . , "1111", may be provided in reverse order of the order, or may be randomly provided.

In an embodiment of the present disclosure, for example, the trim value TV is described as being provide in order of "0000", "0001", "0010", . . . , "1111."

The measurement target 30 may be understood as one selected from a digital component and an analog component.

The measurement target 30 performs an internal operation corresponding to the trim value TV provided by the trim value generator 10, and provides a measured value MV as a result of the internal operation.

If the measurement target 30 is an oscillator, that is, a digital component, the measured value MV may be understood as a square wave signal having a frequency, which is output by the oscillator based on the trim value TV. Furthermore, if the measurement target 30 is a bandgap reference voltage, that is, an analog component, the measured value MV may be understood as a reference voltage output by a bandgap reference voltage generator based on the trim value TV.

The determination unit 50 is configured to receive a reference value RS received from the outside and the measured value MV from the measurement target 30.

The determination unit 50 is configured to determine the measured value MV based on the reference value RS and to provide a trim control signal DS when the measured value MV corresponds to a preset target value. For example, the determination unit 50 may be configured to provide the trim control signal DS to the trim value generator 10.

In this case, the target value may be set as a given value or a given range to be reached by the measured value. The target value may be understood with reference to detailed examples of FIGS. 2 and 4 to be described later.

When receiving the trim control signal DS, the trim value generator 10 provides a current trim value TV, corresponding to a measured value MV, to the storage 70 as a measured result value STV.

The storage 70 stores the measured result value STV. The storage 70 may be configured using various memory devices. For example, the storage 70 may be configured using a non-volatile memory.

The storage 70 may set the measured result value STV for an internal operation of the measurement target 30.

In an embodiment of the present disclosure, a change in a characteristic occurring due to the fabrication process of the measurement target 30 may be corrected based on the measured result value STV set in the storage 70.

Accordingly, if the integrated circuit 100 operates after mass production, the measurement target 30 can perform an internal operation based on the measured result value STV set in the storage 70, and can implement a characteristic having a designed level without a change in a characteristic attributable to the fabrication process.

FIG. 2 illustrates a detailed embodiment in which the measurement target 30 is illustrated as a digital component. The descriptions on configurations and operations of elements redundant with the elements of FIG. 1, among the elements of FIG. 2, are omitted.

FIG. 2 is different from FIG. 1 in that an oscillator 32, that is, a digital component, is included in the measurement target 30 and a counter 52 and a comparator 54 are included in the determination unit 50. The oscillator 32 is configured as a representative for a digital component. A configuration and operation of the oscillator 32 to be described hereinafter may be understood as a configuration and operation of the digital component.

The oscillator 32 receives a trim value TV provided by the trim value generator 10, performs an internal operation corresponding to the trim value TV, and provides a measured value MVF having a frequency as a result of the internal operation.

The oscillator 32 may perform an oscillation operation as an internal operation and provide the measured value MVF having a higher frequency in accordance with an increase in the value of input bits when the trim value TV is changed to have a gradually increasing value in order of "0000", "0001", "0010", . . . , "1111." In this case, the measured value MVF may be understood as a signal having a pulse waveform.

The determination unit 50 determines a frequency of the measured value MVF based on a reference frequency of a reference signal RSF received from the outside and provides a trim control signal DS when the frequency of the measured value MVF corresponds to a preset target value.

To this end, the determination unit 50 includes the counter 52 and the comparator 54.

The counter 52 receives the reference signal RSF from the outside and the measured value MVF from the oscillator 32 and determines the frequency of the measured value MVF based on the reference frequency of the reference signal RSF.

Figure 3:
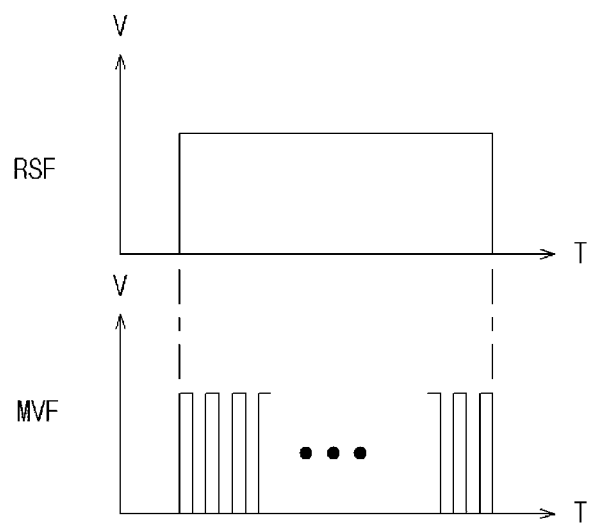
FIG. 3 is a block diagram for illustrating an operation of a counter of FIG. 2.

Referring to FIG. 3, the reference frequency of the reference signal RSF may be set to be lower than that of the measured value MVF.

For convenience of description, it is illustrated that the oscillator 32 is designed to output the measured value MVF having a level of 8 MHz and the reference signal RSF is provided as a level of 8 KHz. It is illustrated that the measured value MVF has a frequency 1000 times higher than the frequency of the reference signal RSF.

If the oscillator 32 outputs the measured value MVF having a designed level without a change in a characteristic, which occurs due to a fabrication process, the measured value MVF having 1000 cycles is included in the reference signal RSF having one cycle.

The oscillator 32 may provide the measured value MVF having a lower frequency than a frequency of 8 MHz due to a change in a characteristic, which occurs due to a fabrication process.

The counter 52 counts how many cycles are included in the measured value MVF during a preset period of the reference signal RSF, for example, during a half cycle or one cycle and provides a count result FC to the comparator 54.

The comparator 54 may set a target value of the count result FC as "1000", for example. When the count result FC does not reach the target value, the comparator 54 gradually increases the trim value TV of the trim value generator 10 based on feedback from the comparator 54.

When the trim value TV is increased by the feedback of the comparator 54, the oscillator 32 provides the measured value MVF having a gradually increased frequency.

When the count result FC reaches the target value in the process, the comparator 54 provides the trim control signal DS to the trim value generator 10.

In the above description, it may be understood that the comparator 54 provides the trim value generator 10 with the trim control signal DS having a low level for the feedback and provides the trim value generator 10 with the trim control signal DS having a high level when the count result FC reaches the target value.

When receiving the trim control signal DS indicating that the count result FC has reached the target value, the trim value generator 10 may provide the current trim value TV, corresponding to the measured value MVF, to the storage 70 as a measured result value STV. The storage 70 may set the measured result value STV for an internal operation of the oscillator 32.

Even in the embodiment of FIG. 2, as described with reference to FIG. 1, a change in a characteristic occurring due to the fabrication process of the oscillator 32, that is, a digital component, may be corrected based on the measured result value STV set in the storage 70.

Accordingly, if the integrated circuit 100 operates after mass production, the oscillator 32 can perform an internal operation based on a measured result value set in the storage 70, and can implement a characteristic having a designed level without a change in a characteristic attributable to a fabrication process.

FIG. 4 illustrates a detailed embodiment in which the measurement target 30 is illustrated as an analog component. The descriptions on configurations and operations of elements redundant with the elements of FIG. 1, among the elements of FIG. 4, are omitted.

FIG. 4 is different from FIG. 1 in that a bandgap reference voltage generator 34 and a characteristic variation unit 36, that is, analog components, are included in the measurement target 30 and a comparator 56 is included in the determination unit 50. The bandgap reference voltage generator 34 is configured as a representative of an analog component. A configuration and operation of the bandgap reference voltage generator 34 to be described hereinafter is a configuration and operation of the analog component.

The bandgap reference voltage generator 34 may be configured to receive a load of the characteristic variation unit 36.

In the case of the bandgap reference voltage generator 34, a change in a characteristic occurring due to a fabrication process may cause a change in the characteristics of transistors configured in the bandgap reference voltage generator 34 or a change in the load characteristic of the characteristic variation unit 36 for an input voltage, driving voltage and bias voltage of the transistors.

The bandgap reference voltage generator 34 may be trimmed to compute a bandgap reference voltage having a designed level, that is, a measured value MVV, by adjusting a load of the characteristic variation unit 36.

As described above, the characteristic variation unit 36 receives a varying trim value TV from the trim value generator 10 and provides the bandgap reference voltage generator 34 with a varying load in accordance with the varying trim value TV.

The bandgap reference voltage generator 34 may perform an internal operation in accordance with a load of the characteristic variation unit 36 and provide the comparator 56 with the measured value MVV having an analog level, that is, a bandgap reference voltage, as a result of the internal operation.

The comparator 56 configured as the determination unit 50 receives a reference signal RSV from the outside and the measured value MVV from the bandgap reference voltage generator 34 and determines an analog level of the measured value RSV based on a reference level of the reference signal RSV.

Figure 5:
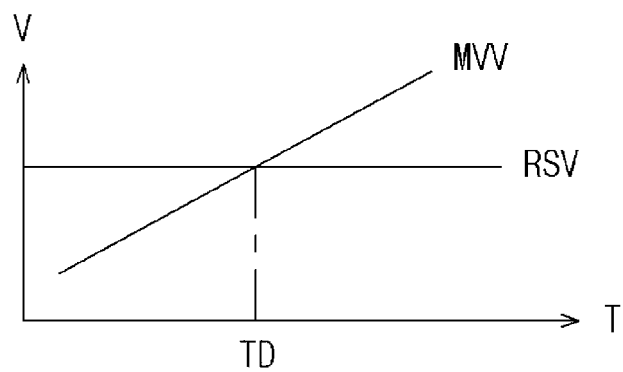
FIG. 5 is a block diagram for illustrating an operation of a comparator of FIG. 4.

Referring to FIG. 5, a reference level of the reference signal RSV has a preset given level. An analog level of the measured value MVV gradually becomes higher in accordance with the varying trim value TV.

The comparator 56 sets a reference level of the reference signal RSV as a target value and compares an analog level of the measured value MVV with the reference level of the reference signal RSV.

The comparator 56 gradually increases the trim value TV of the trim value generator 10 based on feedback when the analog level of the measured value MVV is less than the reference level of the reference signal RSV as a result of the comparison.

When the trim value TV is increased by the feedback of the comparator 56, the bandgap reference voltage generator 34 provides the measured value MVV having a gradually increased level.

In the process, when the measured value MVV reaches the reference level of the reference signal RSV (timing TD in FIG. 5), that is, a target value, as a result of the comparison, the comparator 56 provides a trim control signal DS to the trim value generator 10.

In the above description, it may be understood that the comparator 56 provides the trim value generator 10 with the trim control signal DS having a low level for feedback and provides the trim value generator 10 with the trim control signal DS having a high level when the measured value MVV reaches the target value as a result of the comparison.

When receiving the trim control signal DS indicating that the measured value MVV reaches the reference level of the reference signal RSV, that is, the target value, the trim value generator 10 provides a current trim value TV, corresponding to the measured value MVV, to the storage 70 as a measured result value STV. The storage 70 may set the measured result value STV for an internal operation of the bandgap reference voltage generator 34.

Even in the embodiment of FIG. 4, as described with reference to FIG. 1, a change in a characteristic occurring due to the fabrication process of the bandgap reference voltage generator 34, that is, an analog component, may be corrected based on the measured result value STV set in the storage 70.

Accordingly, if the integrated circuit 100 operates after mass production, the bandgap reference voltage generator 34 can perform an internal operation based on the measured result value set in the storage 70, and can implement a characteristic having a designed level without a change in the characteristic attributable to a fabrication process.

As described above, the integrated circuit having the trim function for a component according to an embodiment of the present disclosure can have advantages in terms of the design and the layout because it requires only a terminal for receiving the reference signal from the outside for the trim function.

Furthermore, the integrated circuit according to an embodiment of the present disclosure can have advantages in that it does not require an external connection or expensive measurement device for a test process and can simply perform a test process, by including simple parts for a trim on a component.

Furthermore, the integrated circuit according to an embodiment of the present disclosure can have an advantage in that it can improve productivity because it can simultaneously perform a test process on many parts by simply performing the test process and it does not require an additional operation after a test process by storing a measured value, obtained as a result of a trim, in the embedded storage.

What is claimed is:

1. An integrated circuit having a trim function for a component, comprising:
   a trim value generator configured to provide a varying trim value;
   a measurement target selected from a digital component and an analog component and configured to provide a measured value as a result of an internal operation corresponding to the trim value;
   a determination unit configured to determine the measured value based on a reference value received from an outside and to provide a trim control signal when the measured value corresponds to a preset target value; and
   a storage configured to store a current trim value as a measured result value in response to the trim control signal.

2. The integrated circuit of claim 1, wherein the trim value generator provides a digital value as the trim value.

3. The integrated circuit of claim 1, wherein the trim value generator
   receives the trim control signal, and
   provides the current trim value to the storage in response to the trim control signal.

4. The integrated circuit of claim 1, wherein:
   the measured result value is set for an internal operation of the measurement target; and
   the measurement target performs the internal operation based on the measured result value after the measured result value is set.

5. An integrated circuit having a trim function for a component, comprising:
   a trim value generator configured to provide a varying trim value;
   a digital component configured to provide a measured value having a frequency as a result of an internal operation corresponding to the trim value;
   a determination unit configured to determine the frequency of the measured value based on a reference frequency of a reference signal received from an outside and to provide a trim control signal when the frequency of the measured value corresponds to a preset target value; and
   a storage configured to store a current trim value as a measured result value in response to the trim control signal.

6. The integrated circuit of claim 5, wherein the trim value generator provides a digital value as the trim value.

7. The integrated circuit of claim 5, wherein the determination unit comprises:
   a counter configured to count the measured value based on the reference signal having a frequency lower than the frequency of the measured value; and
   a comparator configured to provide the trim control signal when a count result of the counter corresponds to the target value.

8. The integrated circuit of claim 7, wherein:
   the counter counts a cycle of the measured value included in a preset period of the reference signal; and
   the determination unit provides the trim control signal when the count result corresponds to the target value.

9. The integrated circuit of claim 5, wherein the trim value generator provides the current trim value to the storage when receiving the trim control signal.

10. The integrated circuit of claim 5, wherein:
    the digital component comprises an oscillator,
    the measured result value for the oscillator is set for an internal operation of the oscillator, and
    the oscillator performs the internal operation based on the measured result value after the measured result value is set.

11. An integrated circuit having a trim function for a component, comprising:
    a trim value generator configured to provide a varying trim value;
    an analog component configured to provide a measured value having an analog level as a result of an internal operation corresponding to the trim value;
    a determination unit configured to determine the analog level of the measured value based on a reference level of a reference signal received from an outside and to provide a trim control signal when the analog level of the measured value corresponds to a preset target value; and
    a storage configured to store a current trim value as a measured result value in response to the trim control signal.

12. The integrated circuit of claim 11, wherein:
    the trim value generator provides a digital value as the trim value;

the analog component comprises a characteristic variation unit configured to act as a load for the measured value; and the characteristic variation unit provides the varying load to the analog component in accordance with the varying trim value.

13. The integrated circuit of claim 11, wherein:

the determination unit comprises a comparator, and the comparator compares the analog level of the measured value with the reference level of the reference signal and provides the trim control signal when a result of the comparison corresponds to the target value.

14. The integrated circuit of claim 11, wherein the trim value generator provides the current trim value to the storage when receiving the trim control signal.

15. The integrated circuit of claim 11, wherein:

the analog component comprises a bandgap reference voltage generator, the measured result value is set for an internal operation of the bandgap reference voltage generator, and the bandgap reference voltage generator performs the internal operation based on the measured result value after the measured result value is set.

\* \* \* \* \*